United States Patent
Sahouria

(10) Patent No.: US 8,930,856 B2
(45) Date of Patent: Jan. 6, 2015

(54) MASK RULE CHECKING BASED ON CURVATURE

(71) Applicant: Mentor Graphics Corporation, Wilsonville, OR (US)

(72) Inventor: Emile Y Sahouria, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/754,421

(22) Filed: Jan. 30, 2013

(65) Prior Publication Data

US 2014/0215414 A1 Jul. 31, 2014

(51) Int. Cl.
*G06F 17/50* (2006.01)

(52) U.S. Cl.
CPC ...................................... *G06F 17/50* (2013.01)
USPC .................. 716/52; 716/50; 716/51; 716/53; 716/54; 716/55; 703/14

(58) Field of Classification Search
CPC .......... G03F 1/144; G03F 1/36; G03F 7/705; G03F 7/70508; G06F 17/5081; G06F 17/5068; G06F 2217/12
USPC ............... 716/50, 51, 52, 53, 54, 55; 703/14; 438/694
See application file for complete search history.

(56) References Cited

U.S. PATENT DOCUMENTS

| | | | | |
|---|---|---|---|---|
| 2003/0115569 A1* | 6/2003 | Ikeuchi | ............................ | 716/19 |
| 2008/0071512 A1* | 3/2008 | Graur et al. | ..................... | 703/14 |
| 2009/0064083 A1* | 3/2009 | Ikeuchi | ............................ | 716/19 |
| 2010/0190342 A1* | 7/2010 | Kotani et al. | .................. | 438/694 |

OTHER PUBLICATIONS

"Advanced manufacturing rules check (MRC) for fully-automated assessment of complex reticle designs," Gladhill et al., Proceedings of SPIE, vol. 5992, 2005.
"Mask design rules (45 nm)—time for standardization," Mason et al, Proceedings of SPIE, vol. 5992, 2005.
"Advanced mask rule check (MRC) tool," Kato et al., Proceedings of SPIE, vol. 6283, 2006.
"Mask rule check for inspection of leading-edge photomask", Sakata et al., Proceedings of SPIE, vol. 5992, 2005.

* cited by examiner

*Primary Examiner* — Brian Ngo

(57) ABSTRACT

Aspects of the invention relate to techniques for mask rule checking based on curvature information. The curvature information comprises convex curvature information and concave curvature information. The convex curvature information for a vertex of a mask feature may comprise a convex curvature value derived based on the size of a circle that passes through the vertex, is tangent to an edge and does not cross any other edges. The concave curvature information for the vertex may comprise a concave curvature value derived based on the size of a circle that is tangent to two edges that form the vertex and does not cross any other edges, and of which distance from the vertex measured from the nearest point is no more than a predetermined number. The generated curvature information is compared with threshold curvature information to determine mask rule violations.

10 Claims, 6 Drawing Sheets

Flow chart 600

Flow chart 600

MASK RULE CHECKING BASED ON CURVATURE

FIELD OF THE INVENTION

The present invention relates to photolithographic processing technologies. Various implementations of the invention may be particularly useful for mask rule checking.

BACKGROUND OF THE INVENTION

Layout design data for an integrated circuit are usually checked with design rule checking (DRC) before tape-out to verify manufacturability. After tape-out, however, the layout design data are changed through the mask data preparation (MDP) process and the derived mask data are not identical to the original layout design data. The MDP process contains many types of data conversion and modification such as fracturing, rotation, mirroring, and magnification. During these data conversions, it is quite possible that some errors might be generated, resulting in a defective photomask (or mask). To address this problem, mask rule checking (MRC) has become an important step in a MDP process. Moreover, mask rule checking has propagated up the design flow. Some limited set of mask rules are often embedded into the optical proximity correction step as a convergence constraint. Mask rule checking is also combined with design rule checking to check the layout data that have been processed by resolution enhancement techniques (including OPC).

Mask manufacturing rules (or mask rules) are based on negotiations with mask suppliers and strike a balance between the needs of the patterning technology in the wafer fabrication facility and the manufacturing capability of the mask shop. These rules are usually determined from assumed or experimentally acquired mask-manufacturing limits. It may take dozens of rules to cover mask writing, inspection, data fracture and other critical process steps to ensure the best possible manufacturability, cost and cycle time advantages. FIG. 3 employs a set of geometric shapes to illustrate some mask manufacturing rules. A narrow line space (B) below the resolution capability of a photomask manufacturing process will easily cause a defect of short circuit. Problems may also occur if two corners are too close together (C, D). Detailed discussion can be found in an article by Mason et al, "Mask design rules (45 nm)—time for standardization," Proceedings of SPIE, Vol. 5992. Similar examples of mask manufacturing rules are also discussed in Kato et al., "Advanced mask rule check (MRC) tool," Proceedings of SPIE, Vol. 6283 and Gladhill et al., "Advanced manufacturing rules check (MRC) for fully automated assessment of complex reticle designs," Proceedings of SPIE, Vol. 5992.

These conventional mask manufacturing rules comprise space check, width check, point distance check and perhaps acute angle check. With photolithography being pushed to fabricate deep-subwavelength devices and mask patterns becoming more complex than conventional Manhattan shapes, however, these simple checks may not be sufficient. Multi-patterning and other techniques needed to extend the 193 immersion capabilities usually depend on a large amount of decoration with optical proximity correction (OPC) shapes. Unlike simple orthogonal SRAFs, the SRAFs for 22 nm/20 nm technology nodes tend to be blobs or curvilinear lines. In the contact and via layers, and particularly for isolated features, extensive use of sub-resolution assist features (SRAFs) is needed to produce the required process window. Another source of complex mask patterns is inverse lithography. Masks computed through use of inverse lithography are known to provide significantly better lithographical performance even than conventional model-based OPC. Such masks, however, generally contain patterns with smaller segments and curved shapes. To efficiently deal with complex patterns, new mask rule checks need to be developed.

BRIEF SUMMARY OF THE INVENTION

Aspects of the invention relate to techniques for mask rule checking based on curvature information. The curvature information comprises convex curvature information and concave curvature information. The convex curvature information for a vertex of a mask feature may comprise a convex curvature value derived based on the size of a circle that passes through the vertex, is tangent to an edge and does not cross any other edges, and of which the center lies on the bisector of an angle associated with the vertex. The concave curvature information for the vertex may comprise a concave curvature value derived based on the size of a circle that is tangent to two edges that form the vertex and does not cross any other edges, and of which distance from the vertex measured from the nearest point is no more than a predetermined number. The generated curvature information is compared with threshold curvature information to determine mask rule violations.

DETAILED DESCRIPTION OF THE INVENTION

Figure 1:
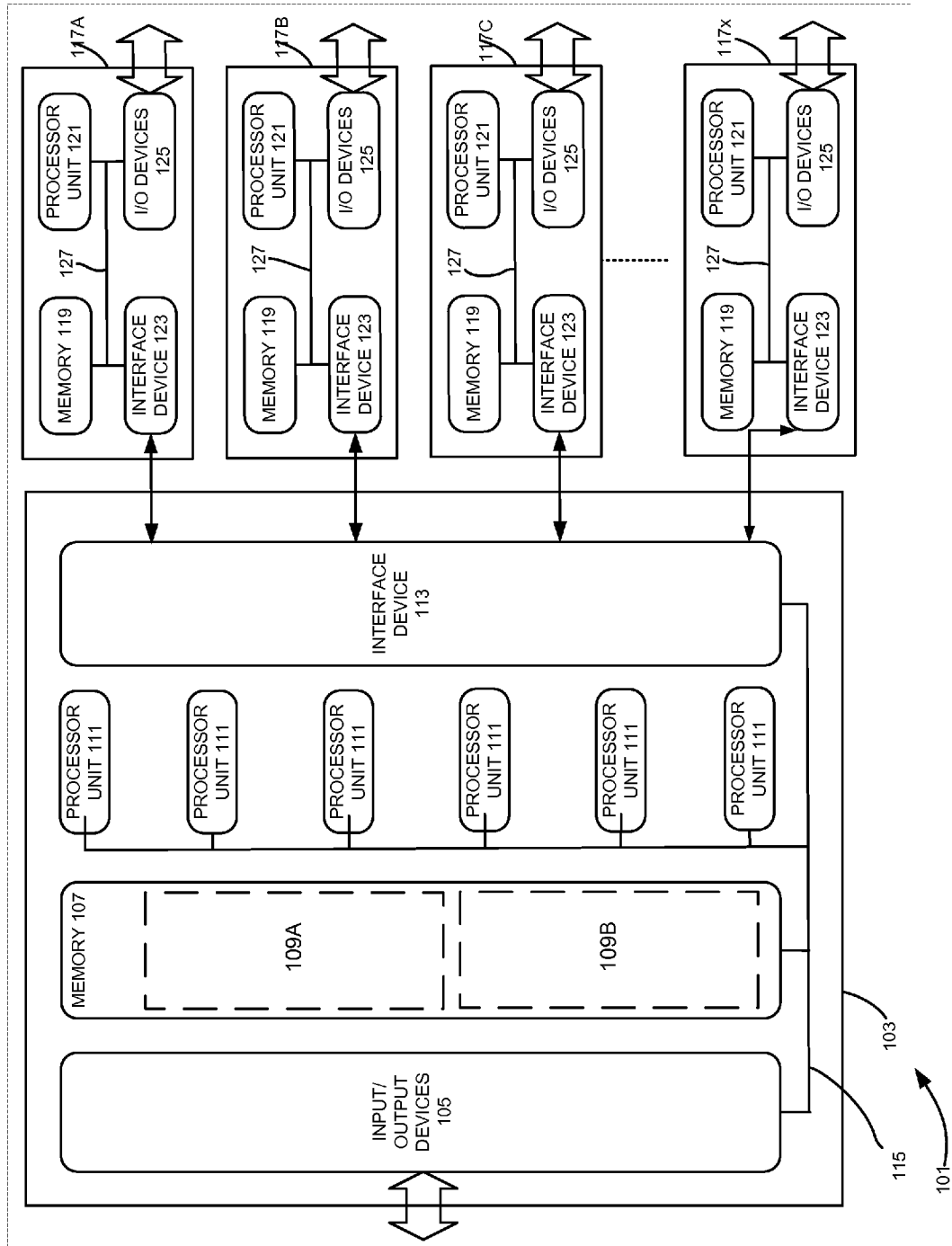
FIG. 1 illustrates an example of a computing system that may be used to implement various embodiments of the invention.

Various aspects of the present invention relate to mask rule checking based on curvature. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "generate" and "check" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
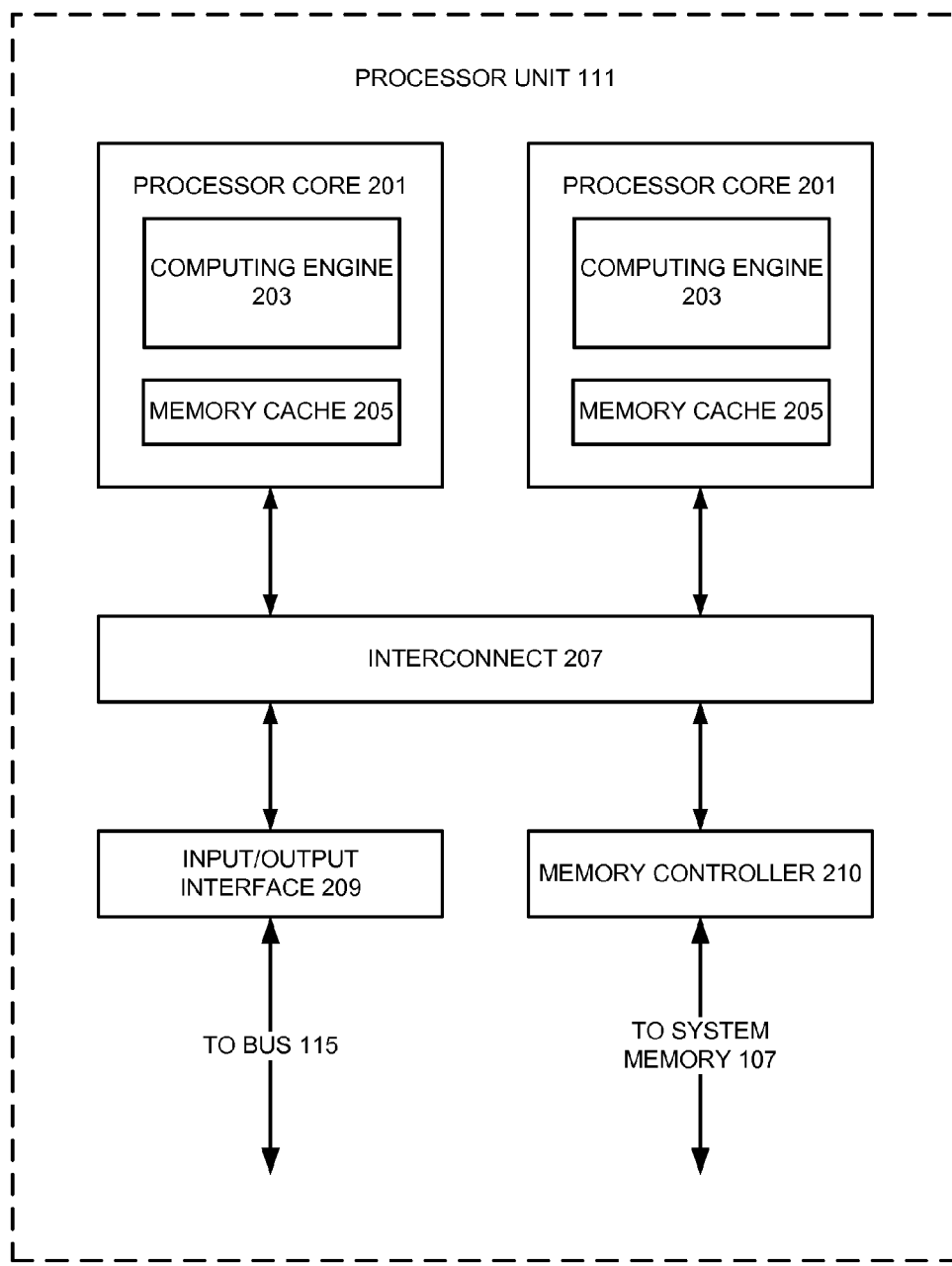
FIG. 2 illustrates an example of a multi-core processor unit that may be used to implement various embodiments of the invention.
Figure 3:
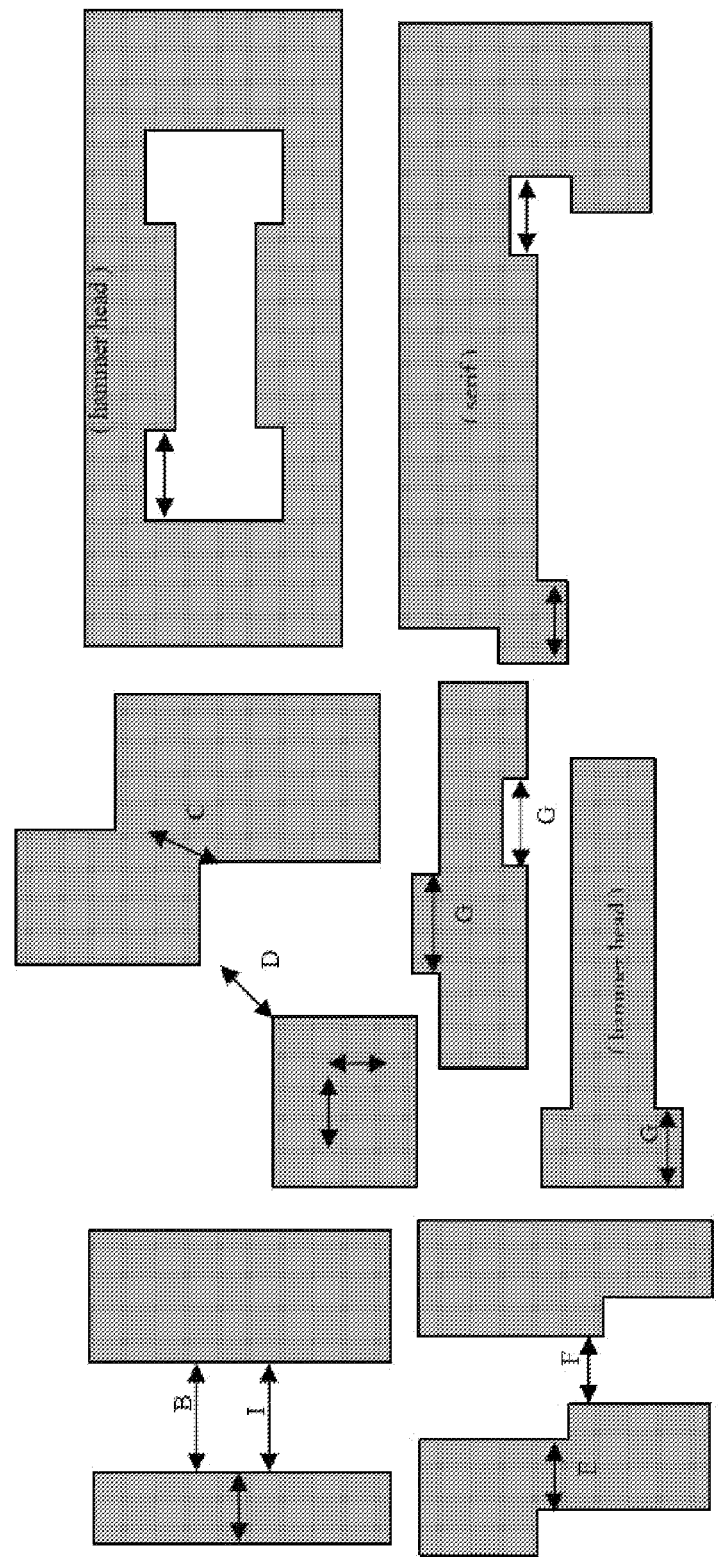
FIG. 3 employs a set of geometric shapes to illustrate some mask manufacturing rules.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Curvature-Based Mask Rule Checking

Figure 5:
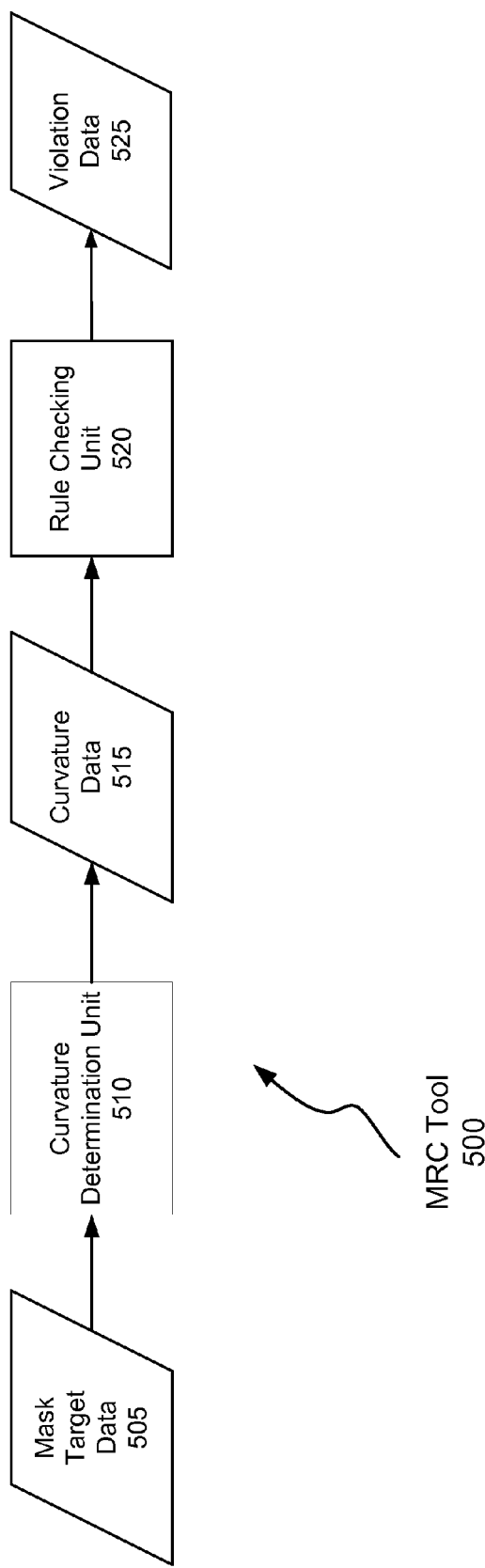
FIG. 5 illustrates an example of an MRC tool that may be implemented according to various embodiments of the invention.

FIG. 5 illustrates an example of an MRC tool 500 that may be implemented according to various embodiments of the invention. As seen in this figure, the MRC tool 500 includes a curvature determination unit 510 and a rule checking unit 520. The curvature determination unit 510 derives curvature data 515 from mask target data 505. The rule checking unit 520 then uses the curvature data 515 to determine violation data 525.

According to some embodiments of the invention, one or both of the curvature determination unit 510 and the rule checking unit 520 are implemented by one or two computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or both of the curvature determination unit 510 and the rule checking unit 520. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 6:
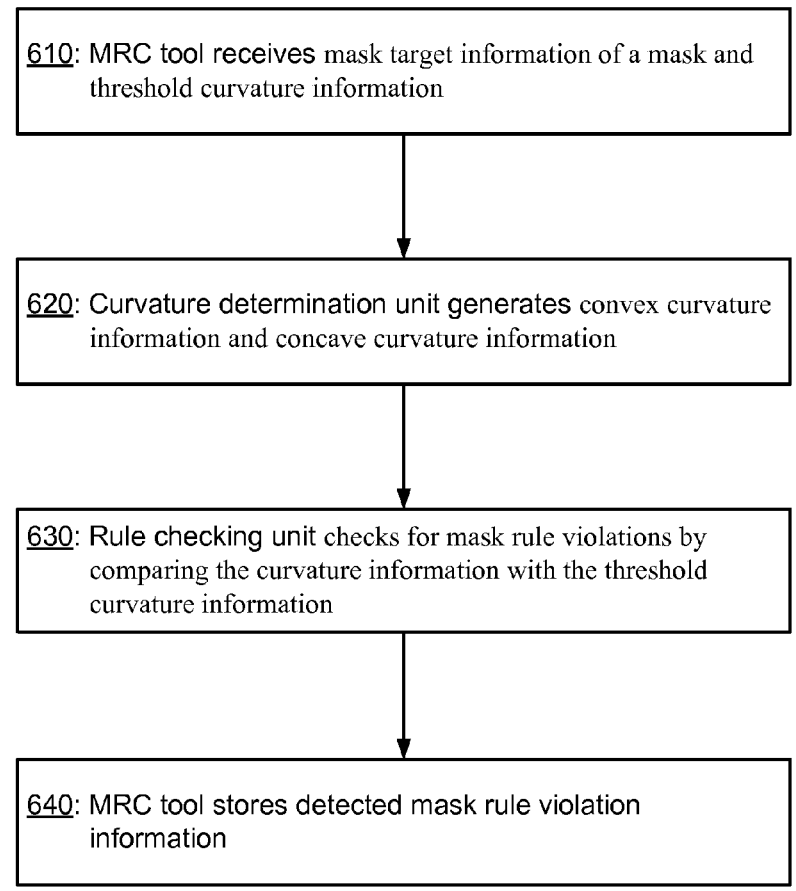
FIG. 6 illustrates a flow chart describing a curvature-based mask rule checking method that may be employed according to various embodiments of the invention.

For ease of understanding, curvature-based mask rule checking methods that may be employed according to various embodiments of the invention will be described with reference to the MRC tool 500 in FIG. 5 and the flow chart 600 illustrated in FIG. 6. It should be appreciated, however, that alternate implementations of an MRC tool may be used to perform the curvature-based mask rule checking methods illustrated by the flow chart 600 according to various embodiments of the invention. Likewise, the MRC tool 500 may be employed to perform other curvature-based mask rule checking methods according to various embodiments of the invention.

Figure 4:
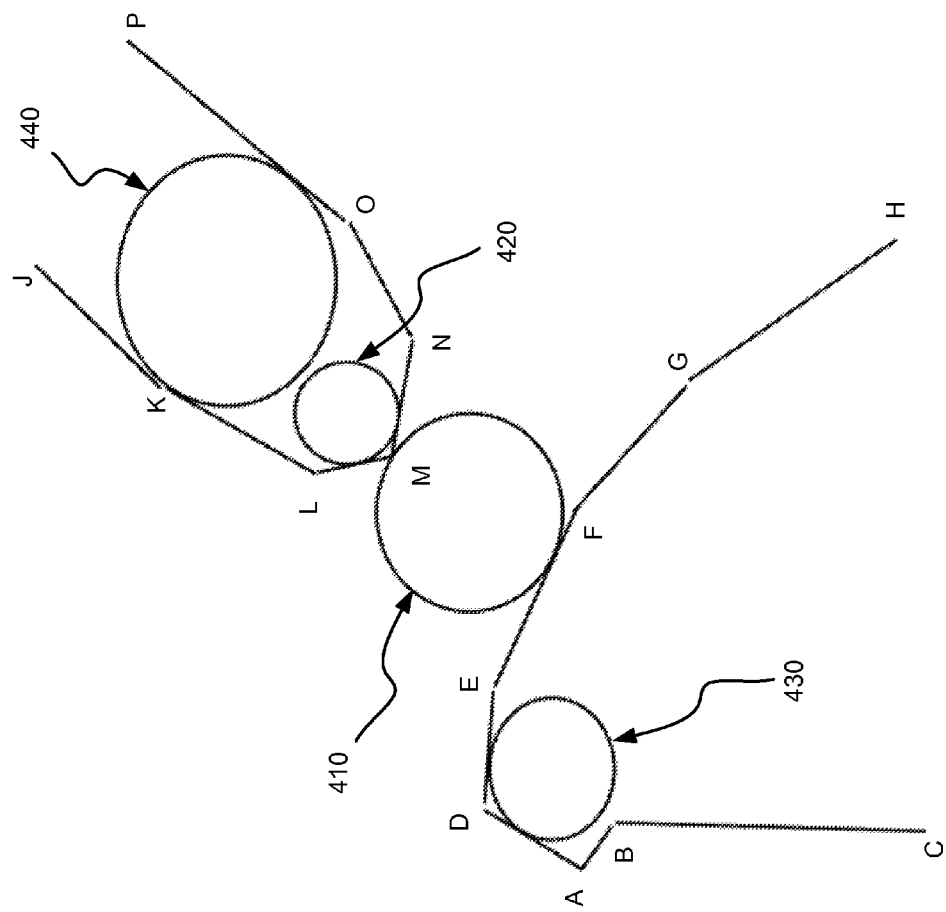
FIG. 4 illustrates an example for how to determine curvature information according to various implementations of the invention.

Initially, in operation 610 of the flowchart 600, the MRC tool 500 receives mask target information of a mask and threshold curvature information. The mask target corresponds to at least a portion of an integrated circuit design Next, in operation 620, the curvature determination unit 510 generates curvature information. The curvature information comprises convex curvature information and concave curvature information. FIG. 4 illustrates an example for how to determine curvature information. M is a vertex of the feature JKLMNOP that is to be patterned on the mask. A convex curvature value and a concave curvature value can be determined for the vertex M. With some implementations of the invention, the curvature determination unit 510 first generates two circles 410 and 420 for the vertex M. The circle 410 is a circle that passes through the vertex M, is tangent to an edge (EF) and does not cross any other edges. Moreover, the center of the circle 410 lies on the bisector of the angle formed by edges LM and MN. Here, the edge EF is an edge for a neighboring mask feature CBADEFGH. The circle 420 is a circle that is tangent to the two edges (LM and MN) that form the vertex M and does not cross any other edges. In addition, the distance of the circle 420 measured from the vertex M to the nearest point of the circle 420 is no more than a predetermined number. The convex curvature value is calculated from the size (radius or diameter) of the circle 410 and the concave curvature value is calculated from the size (radius or diameter) of the circle 420. The smaller a circle, the greater the curvature value.

The circles 440 and 430 can be used to determine concave curvature values for vertices K and D, respectively. The circle for concave curvature determination is usually inside the mask feature associated with the vertex. In some cases, however, the circle for convex curvature determination is insider the mask feature. In FIG. 4, vertex B is such an example.

Next, in operation 630, the rule checking unit 520 checks for mask rule violations by comparing the curvature information with the threshold curvature information. In most cases, the threshold curvature information sets maximum values. A maximum curvature value in some cases corresponds to minimum space between the vertex and an edge. If a curvature value for a vertex is greater than a predetermined threshold value, the region near the vertex may be flagged as a mask rule violation. The MRC tool 500 may use a single threshold curvature value or two threshold curvature values (one for convex curvature and the other for concave curvature). The MRC tool 500 may also choose from a set of threshold curvature values depending upon mask patterns.

In operation 640, the MRC tool 500 stores mask rule violation information if one or more mask rule violations are detected.

As will be appreciated by those of ordinary skill in the art, the mask rule checking methods discussed above can be applied independently or in conjunction with conventional mask rule checking methods.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more non-transitory computer-readable media storing computer-executable instructions for causing one or more processors to perform a method, the method comprising:

receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the convex curvature information comprises a convex curvature value derived based on the size of a circle that passes through the vertex, is tangent to an edge and does not cross any other edges, and of which the center lies on the bisector of an angle associated with the vertex;

checking for mask rule violations by comparing the curvature information with the threshold curvature information; and storing mask rule violation information if one or more mask rule violations are detected.

2. The one or more non-transitory computer-readable media recited in claim 1, wherein the checking for mask rule violations comprises:

determining whether the convex curvature value is greater than a threshold value.

3. One or more non-transitory computer-readable media storing computer-executable instructions for causing one or more processors to perform a method, the method comprising:

receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the concave curvature information comprises a concave curvature value derived based on the size of a circle that is tangent to two edges that form the vertex and does not cross any other edges, and of which distance from the vertex measured from the nearest point is no more than a predetermined number;

checking for mask rule violations by comparing the curvature information with the threshold curvature information; and storing mask rule violation information if one or more mask rule violations are detected.

4. The one or more non-transitory computer-readable media recited in claim 3, wherein the checking for mask rule violations comprises:

determining whether the concave curvature value is greater than a threshold value.

5. A method, comprising:
with a computer,
receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the convex curvature information comprises a convex curvature value derived based on the size of a circle that passes through the vertex, is tangent to an edge and does not cross any other edges, and of which the center lies on the bisector of an angle associated with the vertex;

checking for mask rule violations by comparing the curvature information with the threshold curvature information; and storing mask rule violation information if one or more mask rule violations are detected.

6. The method recited in claim 5, wherein the checking for mask rule violations comprises:

determining whether the convex curvature value is greater than a threshold value.

7. A method, comprising:
with a computer,
receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the concave curvature information comprises a concave curvature value derived based on the size of a circle that is tangent to two edges that form the vertex and does not cross any other edges, and of which distance from the vertex measured from the nearest point is no more than a predetermined number;

checking for mask rule violations by comparing the curvature information with the threshold curvature information; and storing mask rule violation information if one or more mask rule violations are detected.

8. The method recited in claim 7, wherein the checking for mask rule violations comprises:

determining whether the concave curvature value is greater than a threshold value.

9. A system comprising:
one or more processors, the one or more processors programmed to perform a method, the method comprising:
receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the convex curvature information comprises a convex curvature value derived based on the size of a circle that passes through the vertex, is tangent to an edge and does not cross any other edges, and of which the center lies on the bisector of an angle associated with the vertex;

checking for mask rule violations by comparing the curvature information with the threshold curvature information; and storing mask rule violation information if one or more mask rule violations are detected.

10. A system comprising:
one or more processors, the one or more processors programmed to perform a method, the method comprising:
receiving mask target information of a mask and threshold curvature information, the mask target corresponding to at least a portion of an integrated circuit design;

generating curvature information for a vertex of a mask feature of the mask, the curvature information comprising convex curvature information and concave curvature information, wherein the concave curvature information comprises a concave curvature value derived based on the size of a circle that is tangent to two edges that form the vertex and does not cross any other edges, and of which distance from the vertex measured from the nearest point is no more than a predetermined number;

checking for mask rule violations by comparing the curvature information with the threshold curvature information; and storing mask rule violation information if one or more mask rule violations are detected.

\* \* \* \* \*